(12) United States Patent
Moon et al.

(10) Patent No.: US 8,828,523 B2
(45) Date of Patent: Sep. 9, 2014

(54) METHOD FOR MANUFACTURING GRAPHENE USING LIGHT AND GRAPHENE MANUFACTURED USING THE SAME

(71) Applicant: LG Electronics Inc., Seoul (KR)

(72) Inventors: Jinsan Moon, Seoul (KR); Wonbae Park, Seoul (KR); Mynghee Jung, Seoul (KR); Jonghyun Rho, Seoul (KR); Byunghwa Seo, Seoul (KR)

(73) Assignee: LG Electronics Inc., Seoul (KR)

( * ) Notice: Subject to any disclaimer, the term of this patent is extended or adjusted under 35 U.S.C. 154(b) by 60 days.

(21) Appl. No.: 13/749,369

(22) Filed: Jan. 24, 2013

(65) Prior Publication Data

US 2013/0309458 A1    Nov. 21, 2013

(30) Foreign Application Priority Data

May 15, 2012   (KR) .......................... 10-2012-0051391

(51) Int. Cl.
*C01B 31/04*    (2006.01)
*C01B 31/00*    (2006.01)
*H01L 21/18*    (2006.01)

(52) U.S. Cl.
CPC .......... *C01B 31/0446* (2013.01); *H01L 21/187* (2013.01); *C01B 31/00* (2013.01)
USPC ...................................... 428/195.1

(58) Field of Classification Search
CPC   C01B 31/00; C01B 31/0446; C01B 2204/02; H01L 21/02527; H01L 29/1606; B32B 18/00; B32B 2315/02; B32B 38/10; C04B 2237/363; C04B 35/522
USPC ................ 428/195.1; 430/311, 322
See application file for complete search history.

*Primary Examiner* — Caleen Sullivan
(74) *Attorney, Agent, or Firm* — Birch, Stewart, Kolasch & Birch, LLP

(57) ABSTRACT

A method for manufacturing graphene using light capable of transferring and patterning graphene, and graphene manufactured using the method are disclosed. The method includes forming a graphene layer on a catalyst metal layer, attaching a support layer losing adhesion by light on the graphene layer, removing the catalyst metal layer, disposing a substrate on the graphene layer, and separating the support layer from the graphene layer by irradiating light to the support layer.

21 Claims, 9 Drawing Sheets

METHOD FOR MANUFACTURING GRAPHENE USING LIGHT AND GRAPHENE MANUFACTURED USING THE SAME

This application claims the benefit of Korean Patent Application No. 10-2012-0051391, filed on May 15, 2012, which is hereby incorporated by reference as if fully set forth herein.

BACKGROUND OF THE INVENTION

1. Field of the Invention

The present invention relates to a method for manufacturing graphene, and more particularly, to a method for manufacturing graphene using light capable of transferring and patterning graphene, and graphene manufactured using the method.

2. Discussion of the Related Art

Well-known allotropes of pure carbon are fullerene, carbon nanotubes, graphene, and graphite. Among them, graphene has a two-dimensional planar mono-layer structure of carbon atoms.

Particularly, graphene has outstanding and stable electrical, mechanical, and chemical properties as well as excellent conductivity to transport electrons faster than silicon and to allow a larger amount of current to flow than in copper. These properties have been verified through various experiments since a method of separating graphene from graphite was reported in 2004, and much research into graphene has been conducted.

Since a large area graphene can be formed, and graphene has excellent electrical, mechanical, and chemical stability as well as high conductivity, much attention has been paid to graphene as a base material for electronic circuits.

In addition, since electrical properties of graphene sheet with a given thickness may be generally changed depending on crystal orientation, the electrical properties may be controlled by selecting the crystalline orientation of the graphene sheet and to this end, device design may be straightforward. Thus, graphene may be efficiently applied to carbon-based electrical or electronic devices.

SUMMARY OF THE INVENTION

Accordingly, the present invention is directed to a method for manufacturing graphene using light and graphene manufactured using the same that substantially obviate one or more problems due to limitations and disadvantages of the related art.

An object of the present invention is to provide a method for manufacturing graphene using light for minimizing degradation and deformation of a graphene layer during a process of transferring the graphene layer to a substrate, and graphene manufactured using the method.

Another object of the present invention is to provide a method for manufacturing graphene using light capable of forming a pattern in a graphene layer during the transfer process, and graphene manufactured using the method.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of manufacturing graphene using light includes forming a graphene layer on a catalyst metal layer, attaching a support layer losing adhesion by light on the graphene layer, removing the catalyst metal layer, disposing a substrate on the graphene layer, and separating the support layer from the graphene layer by irradiating light to the support layer.

In another aspect of the present invention, a method of manufacturing graphene using light includes forming a graphene layer on a catalyst metal layer, attaching an optical transfer film to the graphene layer, removing the catalyst metal layer, disposing a substrate on the graphene layer, and simultaneously separating the optical transfer film from the graphene layer and patterning the graphene layer by selectively irradiating light to the optical transfer film.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Exemplary embodiments of the present invention will be described in detail. However, the present invention is not restricted to the embodiments but include variations, equivalents, and substitutions of technical configurations of the invention disclosed in the appended claims.

It will also be understood that when an element such as a layer, a region, or a substrate is referred to as being "on" another element, it can be directly on the other element, or intervening elements may also be present.

It will be understood that, although the terms first, second, etc., may be used herein to describe various elements, components, regions, layers and/or sections, these elements, components, regions, layers and/or sections should not be limited by these terms.

Figure 17:
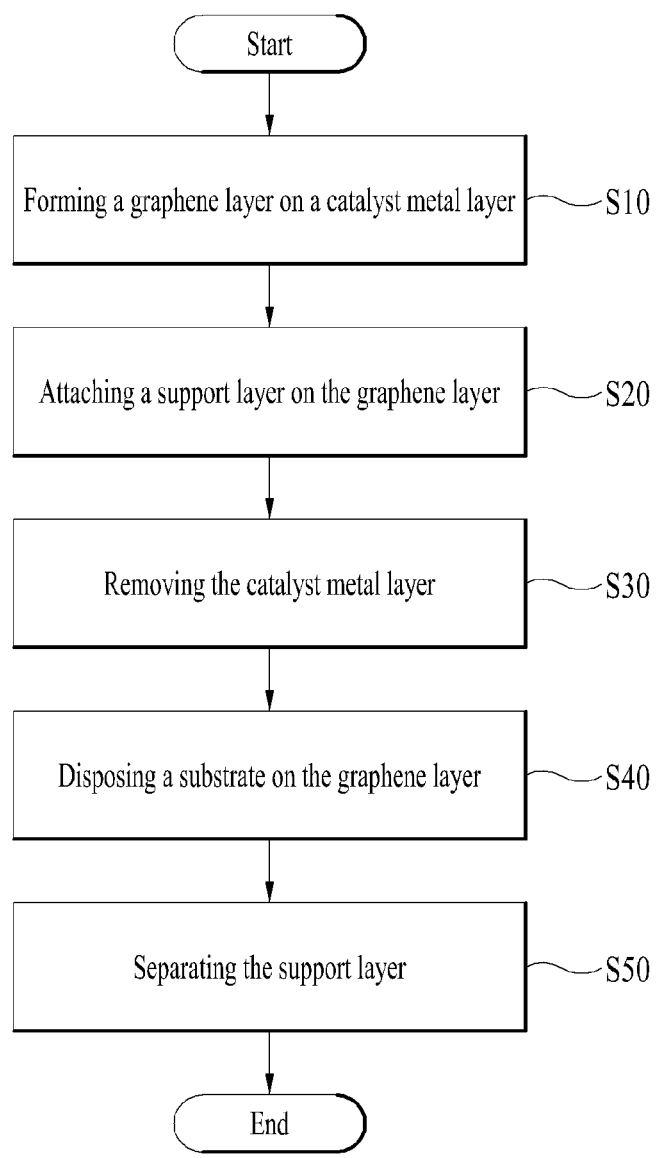
FIG. 17 is a flowchart illustrating a process of manufacturing graphene.

FIG. 17 is a flowchart illustrating a process according to the present invention. The following description will be based on FIG. 17.

Figure 1:
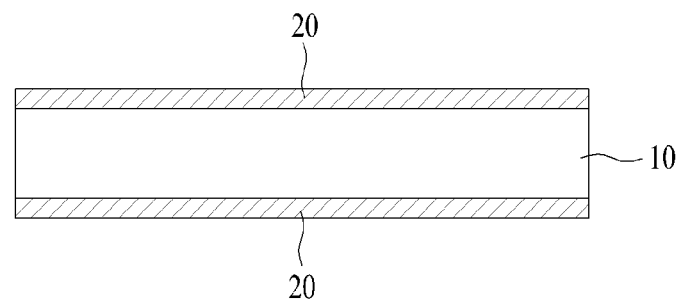
FIG. 1 is a cross-sectional view illustrating a structure in which a graphene layer is formed on a catalyst metal layer.

As shown in FIG. 1, a graphene layer 20 is formed on a catalyst metal layer 10 in order to prepare graphene (S10).

The catalyst metal layer 10 may be formed of metal such as Ni, Co, Fe, Pt, Au, Al, Cr, Cu, Mg, Mn, Mo, Rh, Si, Ta, Ti, W, U, V, and Zr in a layer or an alloy of at least two thereof.

A method of forming the graphene layer 20 on the catalyst metal layer 10 includes chemical vapor deposition (CVD) such as thermal CVD, inductively coupled plasma (ICP) CVD, plasma enhanced (PE) CVD, and microwave CVD, and various other methods such as rapid thermal annealing (RTA), atomic layer deposition (ALD), and physical vapor deposition (PVD).

Figure 2:
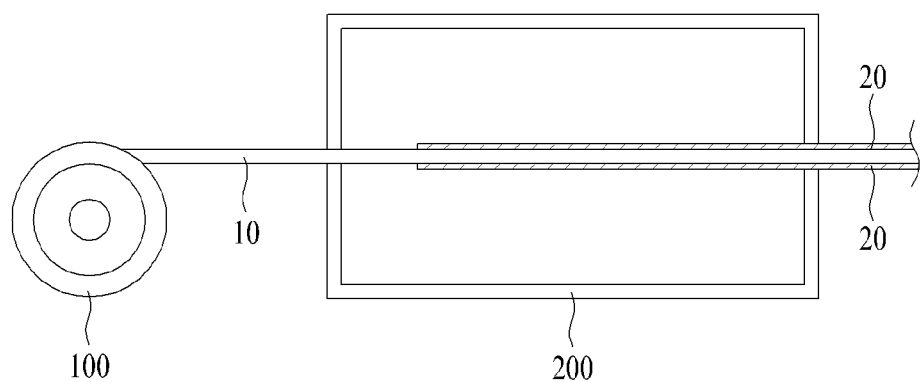
FIG. 2 is a schematic diagram illustrating a device for forming a graphene layer.

FIG. 2 shows an example of forming the graphene layer 20 on the catalyst metal layer 10 using a chemical vapor deposition (CVD).

According to chemical vapor deposition (CVD), a catalyst metal layer 10 is disposed in a chamber 200, and the graphene layer 20 is grown on the surface of the catalyst metal layer 10 by supplying a carbon source into the chamber 200 under suitable growth conditions.

Examples of the carbon source include methane ($CH_4$), acetylene ($C_2H_2$), and the like, in a gas-phase, as well as in a solid-phase such as powder and polymer and liquid-phase such as bubbled alcohol.

In addition, various carbon sources such as ethane, ethylene, ethanol, acetylene, propane, butane, butadiene, pentane, pentene, cyclopentadiene, hexane, cyclohexane, benzene, and toluene may also be used.

Hereinafter, an example of using copper (Cu) as the catalyst metal layer 10 and using methane ($CH_4$) as the carbon source will be described.

When the methane gas is supplied onto the catalyst metal layer 10 in a hydrogen gas atmosphere while maintaining a suitable temperature, reaction between hydrogen and methane occurs, thereby forming the graphene layer 20 on the catalyst metal layer 10. The formation of the graphene layer 20 may be conducted at a temperature ranging from about 300 to about 1500□.

In this regard, if there is no space under the catalyst metal layer 10, the graphene layer 20 may only be formed on the upper surface of the catalyst metal layer 10. However, if there is space under the catalyst metal layer 10, the graphene layer 20 may be formed on both surfaces of the catalyst metal layer 10 as shown FIG. 1.

Since copper used to form the catalyst metal layer 10 has low solubility in carbon, it may be efficiently used to form a mono-layered graphene. The graphene layer 20 may be directly formed on the catalyst metal layer 10.

The catalyst metal layer 10 may be supplied in a sheet form. Alternatively, the catalyst metal layer 10 may be wound on a roller 100 and continuously supplied as shown in FIG. 2. A copper foil with a thickness of about 10 μm to about 10 mm may be used as the catalyst metal layer 10.

If the graphene layer 20 is formed on both surfaces of the catalyst metal layer 10 as described above as shown in FIG. 1, a process of removing the graphene layer 20 from one surface of the catalyst metal layer 10 may further be conducted.

Figure 3:
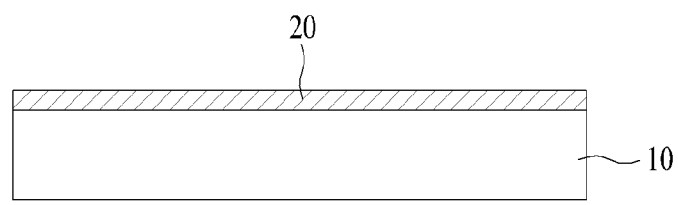
FIG. 3 is a cross-sectional view illustrating a structure in which a graphene layer is formed on one surface of a catalyst metal layer.

According to this process, as shown in FIG. 3, the graphene layer 20 is formed on only one surface of the catalyst metal layer 10.

Figure 4:
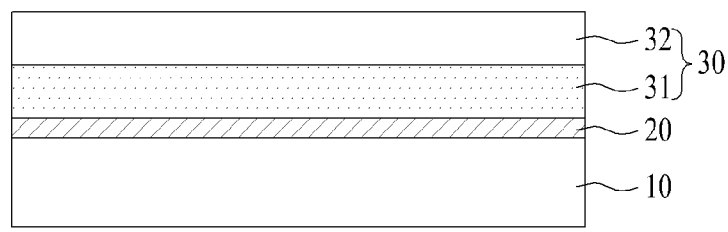
FIG. 4 is a cross-sectional view illustrating a structure in which a support layer is formed on the graphene layer.

Then, as shown in FIG. 4, a support layer 30 is disposed on the graphene layer 20 (S20). The support layer may be an optical transfer film. In this regard, a pressure may be applied to the structure such that the support layer 30 closely contacts the graphene layer 20. Hereinafter, the same reference numeral will be used for the support layer 30 and the optical transfer film 30.

The optical transfer film 30 may include a photoreactive adhesive layer 31. The photoreactive adhesive layer 31 has adhesion that is lost by irradiation of light.

Adhesion of the photoreactive adhesive layer 31 may be generated by an adhesive, and examples of the adhesive include various resins such as a polyurethane resin, an epoxy resin, an acryl resin, a polymer resin, an aqueous adhesive, a vinyl acetate emulsion adhesive, a hot melt adhesive, a visible light curable adhesive, an infrared curable adhesive, an electron beam curable adhesive, a polybenzimidazole (PBI) adhesive, a polyimide adhesive, a silicon adhesive, an imide adhesive, and a bismaleimide (BMI) adhesive.

In addition, the photoreactive adhesive layer 31 may be a reworkable adhesive. That is, the photoreactive adhesive layer 31 is easily delaminated during or after a process and does not leave residues after being delaminated.

The photoreactive adhesive layer 31 loses adhesive force when exposed to light since cross-linkage of polymers of the adhesive breaks by light.

Since the photoreactive adhesive layer 31 loses adhesive force only by the molecular structural change thereof, physical properties of the adhesive layer 31 are not changed by light. Accordingly, physical properties of the attached surfaces are not changed during a delamination process of the optical transfer film 30. Thus, the graphene layer 20 may be delaminated without damage.

The photoreactive adhesive layer 31 may include any adhesive layer 31 that reacts to light such as ultraviolet, visible and infrared light. Hereinafter, an ultraviolet-reactive adhesive layer 31 that reacts to ultraviolet light will be described.

In addition, the optical transfer film 30 may further include a base 32 formed on the photoreactive adhesive layer 31. The base 32 may be formed of any one of polyethylene terephthalate (PET), triacetyl cellulose (TAC), and poly carbonate (PC), but is not limited thereto. Any transparent film-shaped element may be used.

Then, the catalyst metal layer 10 is removed (S30). This process is performed by etching the catalyst metal layer 10 or separating the catalyst metal layer 10 from the graphene layer 20 by applying mechanical force thereto.

The removal of the catalyst metal layer 10 by etching may be performed by dipping the catalyst metal layer 10 alone in an etching solution (not shown).

Figure 5:
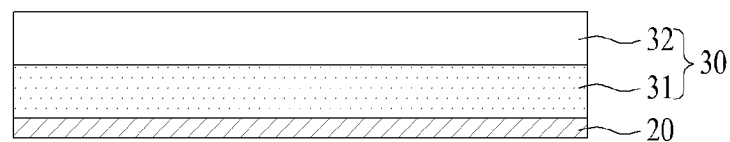
FIG. 5 is a cross-sectional view illustrating a structure in which the catalyst metal layer is removed.

When the catalyst metal layer 10 is removed according to this process, a structure in which the graphene layer 20 is attached to the optical transfer film 30 is obtained as shown in FIG. 5.

Figure 6:
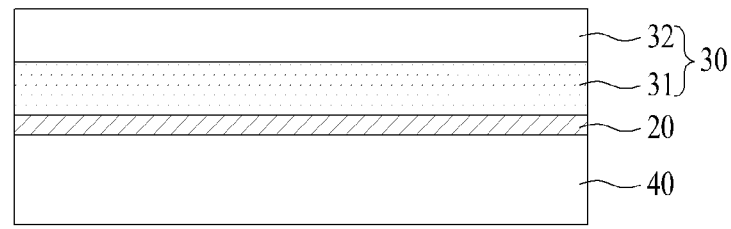
FIG. 6 is a cross-sectional view illustrating a structure in which a substrate is disposed on the graphene layer.

Then, as shown in FIG. 6, a substrate 40 is disposed on the graphene layer 20 exposed by removing the catalyst metal layer 10 (S40).

The substrate 40 may be formed on the graphene layer 20 by direct coating or may be attached to the graphene layer 20. In this regard, when the substrate 40 is attached to the graphene layer 20, pressure may be applied thereto for close contact therebetween.

The substrate 40 may refer to a layer that may be combined with an electronic device with the graphene layer 20.

That is, the substrate 40 may be any transparent or opaque substrate that may be directly used in various display devices or a base that may be directly used in a device such as a touch panel.

The substrate 40 may include any material such as polyethylene terephthalate (PET), triacetyl cellulose (TAC), and poly carbonate (PC), or may be a wafer formed of a semiconductor material such as silicon (Si). In addition, any transparent and opaque film-shaped element may also be used.

Then, the optical transfer film 30 is separated from the graphene layer 20 by irradiating light. According to the current embodiment, when ultraviolet (UV) light is irradiated to the optical transfer film 30, bindings of polymers constituting the photoreactive adhesive layer 31 break, causing the photoreactive adhesive layer 31 to lose adhesion, so that the optical transfer film 20 may be separated from the graphene layer 20.

In this regard, light used therefor may have an energy of about 10 to about 1000 mJ/cm$^2$.

As occasion demands, the attachment of the substrate 40 to the graphene layer 20 and the irradiation of light may be simultaneously conducted. In other words, while pressure is applied to the substrate 40 toward the graphene layer 20, light may be irradiated thereto.

As described above, by the separation of the optical transfer film 30, the graphene layer 20 is transferred from the optical transfer film 30 to the substrate 40. Here, the graphene layer 20 may not be physically damaged, or physical damage to the graphene layer 20 may be minimized during transfer of the graphene layer 20 by using the optical transfer film 30 as a support layer.

For example, a thermal transfer film that loses adhesive force by heat loses adhesive force while a capsule contained in an adhesive layer swells by heat. During this process, the adhesive surface may be physically changed. Such physical change may cause damage to the graphene layer 20.

However, since the surface of the optical transfer film 30 including the photoreactive adhesive layer 31 does not physically change, physical damages to the graphene layer 20 caused while transferring the graphene layer 20 and deterioration of properties of the graphene layer 20 thereby may be minimized.

Furthermore, deformation of the substrate 40 by heat may be inhibited.

Figure 7:
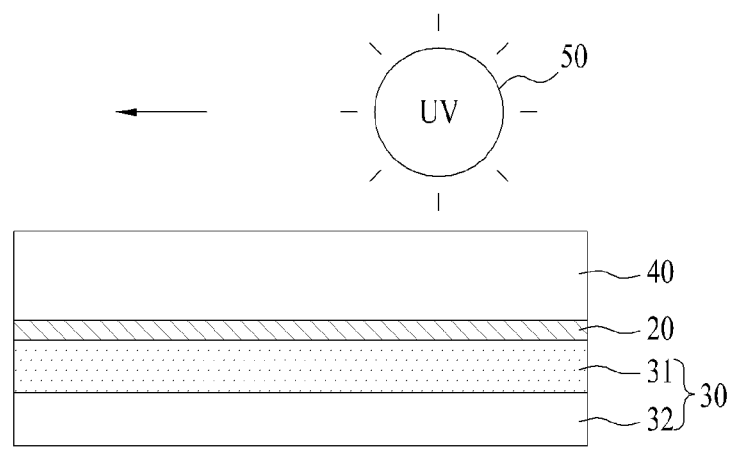
FIG. 7 is a cross-sectional view illustrating a first example of irradiating light to the substrate.

The irradiation of light may be performed using a cylindrical UV light source 50 as shown in FIG. 7. While moving the light source 50 in the lengthwise direction of the substrate 40, UV light may be irradiated to the substrate 40.

In this regard, since light is irradiated by the cylindrical UV light source 50 in the lengthwise direction of the cylindrical shape, light may be irradiated in a scanning method using linear UV light.

Figure 8:
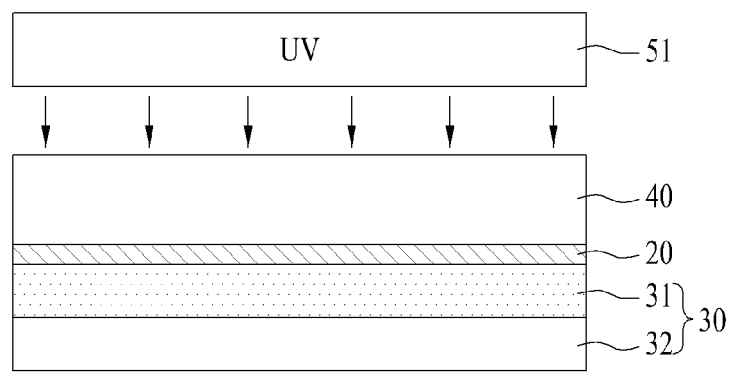
FIG. 8 is a cross-sectional view illustrating a second example of irradiating light to the substrate.

In addition, as shown in FIG. 8, UV light may be irradiated toward the substrate 40 using a surface light source 51 emitting UV light. Since the light source 51 uniformly emits UV light to the surface, light may be irradiated in a sheet-like manner.

As the light source 50, a point light source and a line light source may also be used. In addition, in FIGS. 7 and 8, the light sources 50 and 51 are disposed above the substrate 40. However, the light sources 50 and 51 may also be disposed at opposite sides thereof. That is, the light sources 50 and 51 may irradiate light above the optical transfer film 30.

Figure 9:
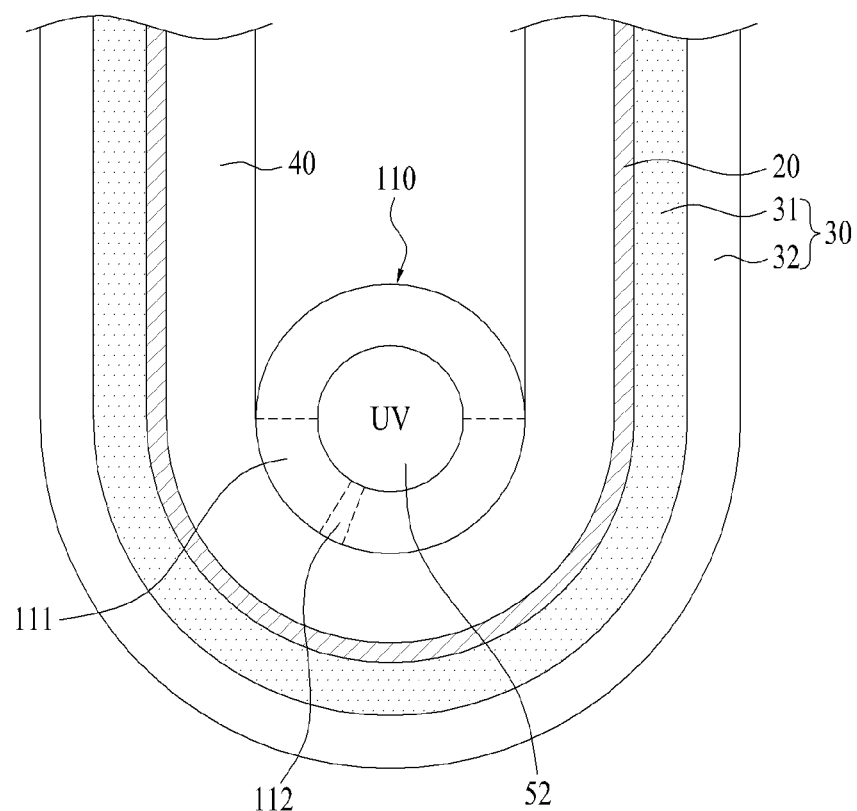
FIG. 9 is a cross-sectional view illustrating a third example of irradiating light to the substrate.

Meanwhile, as described above, the manufacturing and transferring processes of the graphene layer 20 may be consecutively performed using a roller 100 (FIG. 2). As such, if the manufacturing and transferring processes of the graphene layer 20 are conducted using the roller 100, UV light may be irradiated from a UV light source 52 disposed in a transport roller 110 that transports elements such as the substrate 40 provided with the graphene layer 20 and the optical transfer film 30 as shown in FIG. 9.

In other words, the UV light source 52 is disposed in the transport roller 110 in a rod shape, and a contact unit 111 that is in contact with an element such as the substrate 40 may be disposed at the external surface thereof.

In this regard, the contact unit 111 may have at least one transparent portion such that UV light from the light source 52 may be irradiated to the transferred optical transfer film 30 via the transport roller 110.

In addition, since the contact unit 111 has a slit 112, the other portions of the contact unit 111 excluding the transparent slit 112 may be formed of a rubber-like opaque material suitable for the transport of the element.

Figure 10:
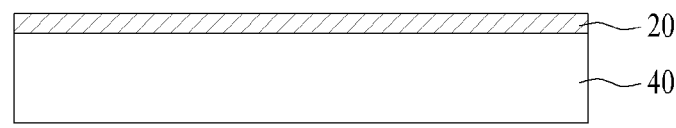
FIG. 10 is a cross-sectional view illustrating a structure in which a graphene layer is transferred onto the substrate.

According to the process as described above, when UV light is irradiated to the optical transfer film 30, the optical transfer film 30 is separated from the graphene layer 20 as described above to form a structure shown in FIG. 10. That is, the transfer process is conducted to form a structure in which the graphene layer 20 is disposed on the substrate 40.

Meanwhile, while the graphene layer 20 is transferred to the substrate 40 by separating the optical transfer film, a pattern of the graphene layer 20 may be formed. This is possible since the optical transfer film 30 is separated using light.

Figure 11:
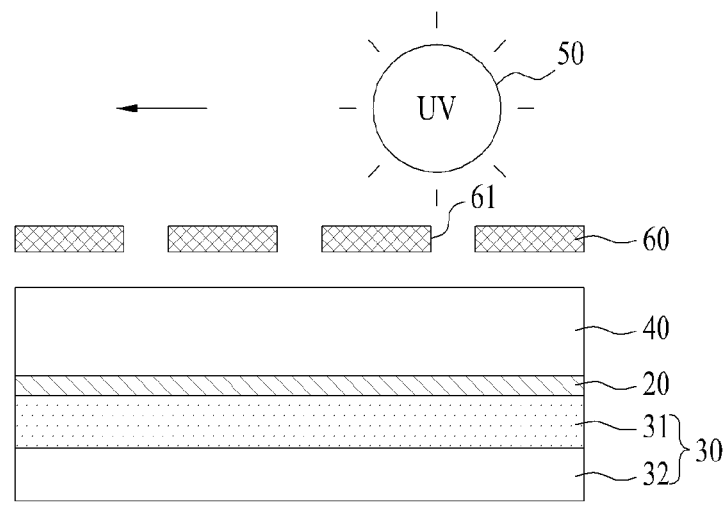
FIG. 11 is a cross-sectional view illustrating a first example of irradiating light to a pattern mask.

For this, as shown in FIG. 11, a pattern mask 60 with openings 61 for forming a pattern is disposed at the substrate 40 side, and then UV light may be irradiated by the UV light source 50 toward the pattern mask 60.

The graphene layer 20 may have a pattern according to the shape of the openings 61 of the pattern mask 60. That is, the shape of the openings 61 of the pattern mask 60 may be substantially the same as a pattern 21 (FIG. 16) formed on the graphene layer 20.

The pattern mask 60 may be a metal mask. However, masks formed of any other materials may also be used.

Figure 12:
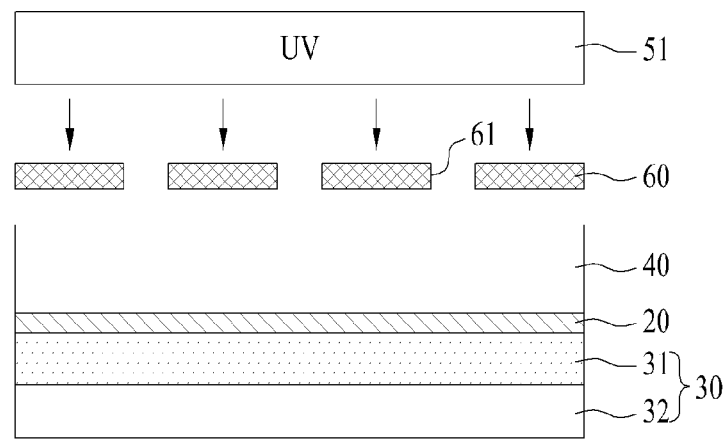
FIG. 12 is a cross-sectional view illustrating a second example of irradiating light to the pattern mask.

The irradiation of UV light using the pattern mask 60 may be conducted using a surface light source 51 as shown in FIG. 12.

Figure 13:
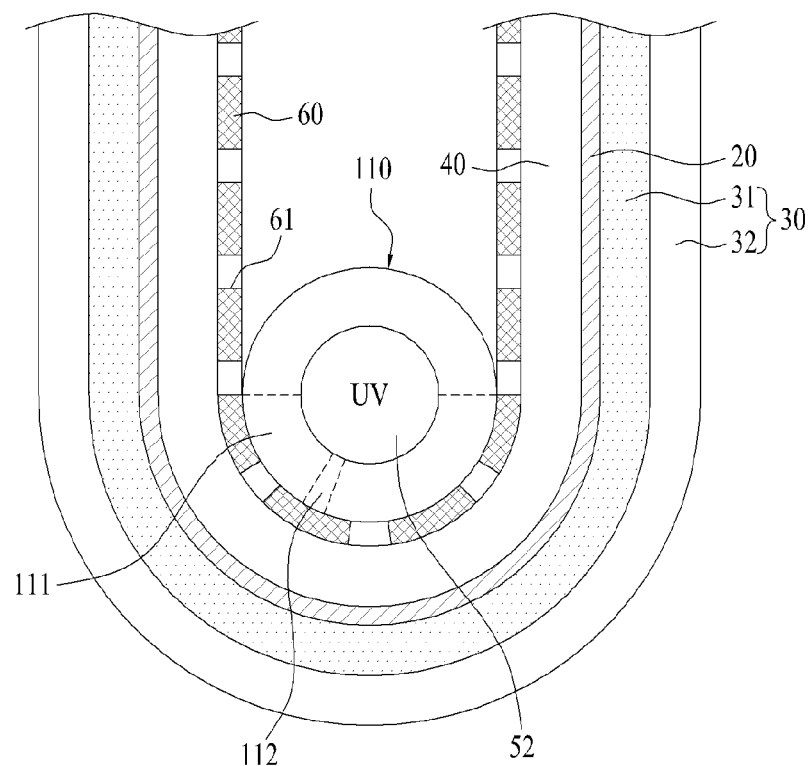
FIG. 13 is a cross-sectional view illustrating a third example of irradiating light to the pattern mask.

In addition, as described above, light may be irradiated using a cylindrical light source 52 integrated with the transport roller 110 that transports an element including the graphene layer 20 as shown in FIG. 13.

In this regard, the pattern mask 60 may be transported along with the graphene layer 20 and the optical transfer film 30 in a state of being attached to the substrate 40. For this, the pattern mask 60 may be formed of a flexible material and has the same width as the substrate 40, thereby being easily transported by the transport roller 110.

As described above, the transport roller 110 includes a contact unit 111. Since at least one portion of the contact unit 111 is transparent, UV light from the light source 52 is irradiated to the optical transfer film 30 transported by the transport roller 110. Since the contact unit 111 has a slit 112, light may be irradiated by the light source 52.

Meanwhile, in order to prepare the graphene layer 20 with a pattern, patterning using laser beams may be used. When patterning is performed using laser beams, a desired pattern may be formed without using a pattern mask.

Figure 14:
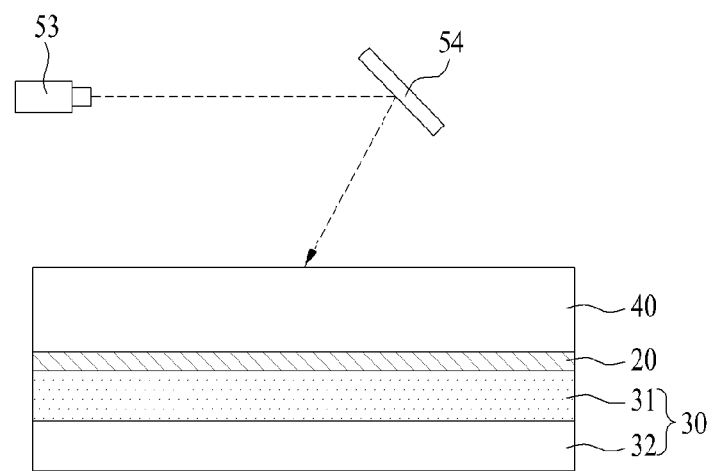
FIG. 14 is a cross-sectional view illustrating a fourth example of irradiating light to the pattern mask.

For example, as shown in FIG. 14, a laser beam 53 may be irradiated to a desired portion for forming a pattern using a laser 53 and a scanning mirror 54.

In this regard, the optical transfer film 30 may also have the photoreactive adhesive layer 31 that reacts to light from the laser 53.

The scanning mirror 54 is also referred to as a microscanner. The scanning mirror 54 may move in at least two axial directions such that the light from the laser 53 is reflected and raster scanned on a flat or curved surface.

Thus, since the scanning mirror 54 has two degrees of freedom of axial movement, as such, the axial movement of the scanning mirror 54 may be controlled in two independent directions for patterning, light may be irradiated by the laser 53 to the substrate 40 to form a desired pattern.

Figure 15:
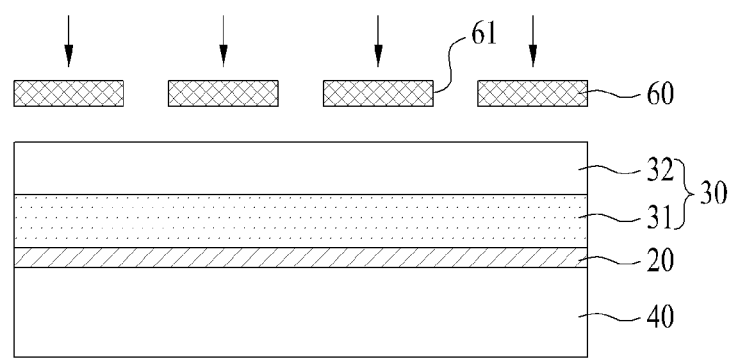
FIG. 15 is a cross-sectional view illustrating another example of irradiating light to the pattern mask.

Meanwhile, as shown in FIG. 15, irradiation of light may also be conducted not at the substrate 40 side but at the optical transfer film 30 side.

In other words, since the base 32 may be formed of a transparent material, the graphene layer 20 may be patterned by disposing the pattern mask 60 having the openings 61 on the optical transfer film 30 and irradiating light thereto.

According to the above-mentioned process, regions of the photoreactive adhesive layer 31 exposed to light lose adhesive force. The graphene layer 20 is separated at the regions from which adhesive force is lost.

Figure 16:
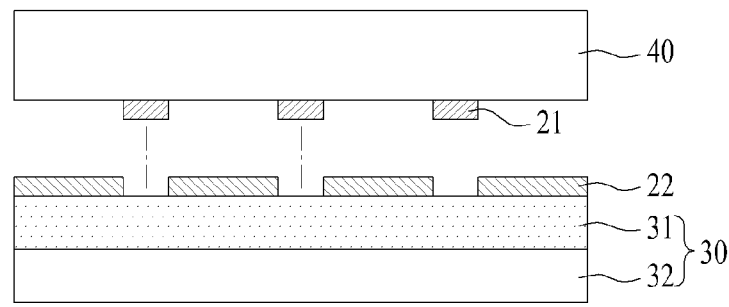
FIG. 16 is a cross-sectional view illustrating a structure in which a graphene pattern is transferred onto the substrate.

That is, as shown in FIG. 16, since the exposed regions of the photoreactive adhesive layer 31 lose adhesive force, the graphene pattern 21 exposed to light is separated from the photoreactive adhesive layer 31 to be transferred to the substrate 40. The other regions 22 of the graphene layer 20 not exposed to light are in contact with the photoreactive adhesive layer 31 during separation.

As such, the non-exposed regions 22 of the graphene layer 20 are separated along with the support layer 30 including the optical transfer film 30 from the substrate 40, so that the transfer of graphene may be simultaneously conducted with the formation of the graphene pattern.

In addition, damage to and deformation of the substrate 40 may be prevented or minimized.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing graphene using light, the method comprising:
    forming a graphene layer on a catalyst metal layer;
    attaching a support layer losing adhesion by light on the graphene layer;
    removing the catalyst metal layer;
    disposing a substrate on the graphene layer; and
    separating the support layer from the graphene layer by irradiating light to the support layer.

2. The method according to claim 1, wherein the support layer comprises an optical transfer film.

3. The method according to claim 2, wherein the optical transfer film comprises:
    a base; and
    a photoreactive adhesive layer having adhesion and losing adhesion in response to light.

4. The method according to claim 3, wherein the photoreactive adhesive layer is an UV reactive adhesive layer losing adhesion in response to UV light.

5. The method according to claim 1, wherein the separating of the support layer by irradiating light is performed using a surface light source or a cylindrical light source.

6. The method according to claim 5, wherein at least one of the catalyst metal layer, the graphene layer, the support layer, and the substrate is transported by a roller.

7. The method according to claim 6, wherein the roller comprises the cylindrical light source.

8. The method according to claim 7, wherein the roller comprising the cylindrical light source comprises a contact unit having at least one transparent portion or a slit.

9. The method according to claim 1, further comprising disposing a pattern mask on the support layer after disposing the substrate on the graphene layer.

10. The method according to claim 9, wherein the separating of the support layer by irradiating light to the support layer is performed by patterning such that the graphene has the pattern.

11. The method according to claim 9, wherein non-exposed portions of the graphene by the pattern mask are separated from the substrate along with the support layer.

12. The method according to claim 1, wherein the separating of the support layer by irradiating light to the support layer is performed by irradiating light via laser scanning.

13. The method according to claim 12, wherein the laser scanning is performed using a scanning mirror.

14. The method according to claim 1, wherein the disposing of the substrate on the graphene layer and the irradiating of light to the support layer are simultaneously performed.

15. A method of manufacturing graphene using light, the method comprising:
    forming a graphene layer on a catalyst metal layer;
    attaching an optical transfer film to the graphene layer;
    removing the catalyst metal layer;
    disposing a substrate on the graphene layer; and
    simultaneously separating the optical transfer film from the graphene layer and patterning the graphene layer by selectively irradiating light to the optical transfer film.

16. The method according to claim 15, wherein the optical transfer film comprises:
    a base; and
    a photoreactive adhesive layer having adhesion and losing adhesion in response to light.

17. The method according to claim 15, wherein the selectively irradiating of light to the optical transfer film is performed by disposing a pattern mask on the optical transfer film.

18. The method according to claim 15, wherein the selectively irradiating of light to the optical transfer film is performed by laser scanning.

19. The method according to claim 15, wherein at least one of the catalyst metal layer, the graphene layer, the optical transfer film, and the substrate is transported by a roller.

20. A graphene manufactured using a method according to claim 1.

21. A graphene manufactured using a method according to claim 15.

* * * * *